United States Patent [19]

Poteet et al.

[11] Patent Number: 4,630,240

[45] Date of Patent: Dec. 16, 1986

[54] DYNAMIC MEMORY WITH INTERMEDIATE COLUMN DERODE

[75] Inventors: Ken A. Poteet, Houston; Shuen C. Chang, Sugarland, both of Tex.

[73] Assignee: Texas Instruments Incorporated, Dallas, Tex.

[21] Appl. No.: 626,791

[22] Filed: Jul. 2, 1984

[51] Int. Cl.[4] .............................................. G11C 7/00
[52] U.S. Cl. .................................... 365/189; 365/230
[58] Field of Search ........................ 365/189, 230, 233

[56] References Cited

U.S. PATENT DOCUMENTS

4,094,012 6/1978 Perlegos et al. ................ 365/189 X
4,533,843 8/1985 McAlexander, III .......... 365/230 X

*Primary Examiner*—Joseph A. Popek
*Attorney, Agent, or Firm*—John G. Graham; Rodney M. Anderson

[57] ABSTRACT

A dynamic read/write memory array has a column decode and data input/output arrangement constructed to compensate for large capacitive loads in the I/O circuitry. In a first stage, a buffer is employed between sense amplifiers and segmented intermediate I/O lines. Each segment is a small fraction of the I/O load. First-level column decoding selects one column for each segment. A second level of column decoding employs tri-state buffers which can only be activated during a read with the proper column address. When writing, all buffers are in the high impedance state for reading while the selected buffer is written into through decoded pass gates.

30 Claims, 7 Drawing Figures

DYNAMIC MEMORY WITH INTERMEDIATE COLUMN DERODE

RELATED CASES

This application discloses subject matter also disclosed in copending application Ser. No. 630,507, filed July 11, 1984, Ser. No. 634,898, filed July 26, 1984; Ser. No. 634,901, filed July 26, 1984; Ser. No. 636,941, filed Aug. 2, 1984; Ser. No. 640,716, filed Aug. 14, 1984; and Ser. No. 640,717, filed Aug. 14, 1984; all assigned to Texas Instruments.

BACKGROUND OF THE INVENTION

This invention relates to semiconductor devices, and more particularly to static column decode circuits for semiconductor dynamic memory devices.

Dynamic MOS read/write memory devices have been constructed generally as shown in U.S. Pat. No. 4,081,701 (a 16K dynamic ROM) issued to White, McAdams and Redwine, or U.S. Pat. No. 4,239,993 (a 64K dynamic RAM) issued to McAlexander, White and Rao, both assigned to Texas Instruments. In each of these prior devices a cell array which was $\sqrt{N}$ on a side was used, where N is the number of cells. Thus, a 64K device had 256 rows and 256 columns. A bistable sense amplifier was connected to a pair of bit lines; there was one sense amplifier for each column, each column having two bit lines. In these square arrays, the refresh cycle was equal to the number of column lines, or the number of sense amplifiers. However, when the bit density of a dynamic RAM increases to levels such as 256K-bits or 1-Megabit, the number of sense amplifiers must be increased beyond $\sqrt{N}$ (where N is the total number of bits), because the number of cells per bit line cannot exceed about 128 due to capacitance ratios and series resistance, and the refresh cycle must not exceed about 256 or 512-per refresh period.

To provide a 256 cycle refresh in a 1-Megabit DRAM, the number of columns must be 4096 in a simple array, i.e., 256 rows by 4096 columns. By addressing two rows per refresh cycle, this can be reduced to a 512×2048 array. Even so, the number of columns coupled to a given I/O or $\overline{I/O}$ data path in this case would be entirely too large due to the parasitic capacitance of such a number of column lines. When static column decoding is included, the circuit design becomes more difficult.

It is the principal object of this invention to provide a data input/output arrangement for a high density dynamic RAM. Another object is to provide high speed data I/O circuitry for a dynamic RAM.

SUMMARY OF THE INVENTION

In accordance with one embodiment of the invention, a dynamic read/write memory array has a column decode and data input/output arrangement constructed to compensate for large capacitive loads in the I/O circuitry. In a first stage, a buffer is employed between sense amplifiers and segmented intermediate I/O lines. Each segment is a small fraction of the I/O load. First-level column decoding selects one column for each segment. A second level of column decoding employs tri-state buffers which can only be activated during a read with the proper column address. When writing, all buffers are in the high impedance state for reading while the selected buffer is written into through decoded pass gates.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
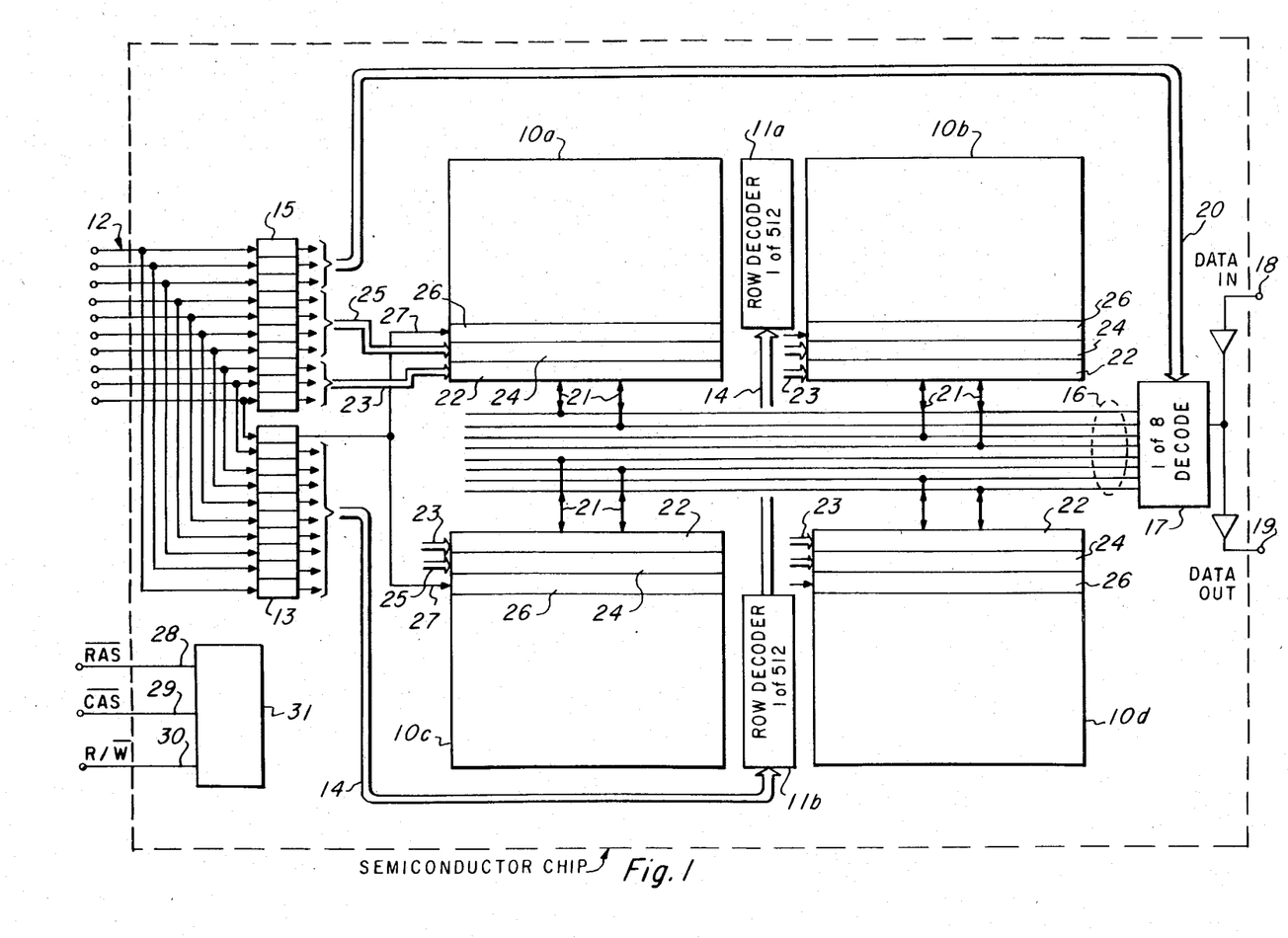
FIG. 1 is an electrical diagram in block form of a dynamic memory device of the 1-Megabit size which may use the column I/O circuits of the invention.

Referring to FIG. 1, a block diagram of a semiconductor read/write memory chip constructed according to the invention is illustrated. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives a 9-bit row address from address input pins 12 by way of row address latches 13 and lines 14. A 10-bit column address is also applied to the input pins 12, in time-multiplexed manner, and this column address is applied to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen intermediate output buffers 22 for each block, using three bits of the column address on lines 23 from buffers 15. A 1-of-16 column selection is made in each of sixteen sets of sixteen intermediate output buffers 24 in each block 10a-10d, using four bits of the column address on lines 25 from buffers 15. Each one of 512 sense amplifiers 26 in each block is connected to one of the columns in the array (each column is made up of two column line halves or "bit lines"). Each buffer 24 is coupled to one of two columns; this selection is based on a one-bit column address on line 27. The memory device receives a row address strobe $\overline{RAS}$ on input pin 28, and a column address strobe $\overline{CAS}$ on input pin 29. Selection of a read or a write operation is made by a $R/\overline{W}$ control on an input pin 30. A clock generator and control circuit 31 produces all of the internal clocks and controls as needed.

This device of FIG. 1 employs "static column decode", which means that after a row address had been strobed in by $\overline{RAS}$, and $\overline{CAS}$ has dropped to signal a standard read or write, then the column address appearing in the pins 12 can be changed at will and the selected column data for the instantaneous column address is available for I/O. A separate $\overline{CAS}$ strobe is not needed for each new column address.

Figure 2:
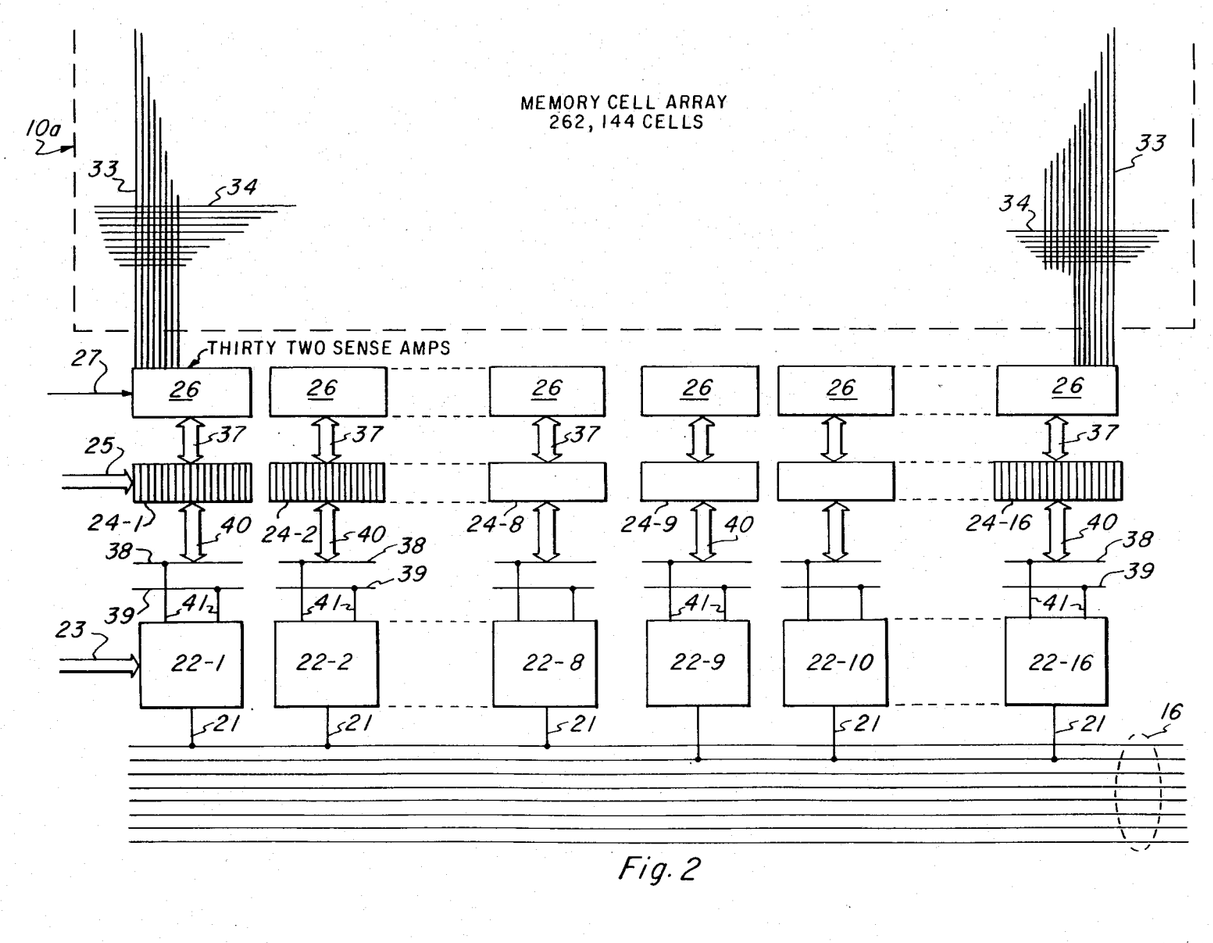
FIG. 2 is an electrical diagram in block form of a part of the memory device of FIG. 1.

Referring to FIG. 2, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the buffers 22-1 . . . 22-16, there is a set of sixteen buffers 24; here these sets are labelled 24-1 through 24-16 (16 in each set). For each set of sixteen buffers 24, a group of thirty-two sense amplifiers 26 is provided, and each sense amplifier is connected to two of the bit lines (one column, or two column line halves) 33. Intersecting the bit lines 33 are 512 row lines 34 in the memory cell array. The tenth bit of the row address is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other sied by lines 41. Note that the I/O changes from double rail at the lines 38 and 39 to single rail at the data I/O lines 16.

Figure 3:
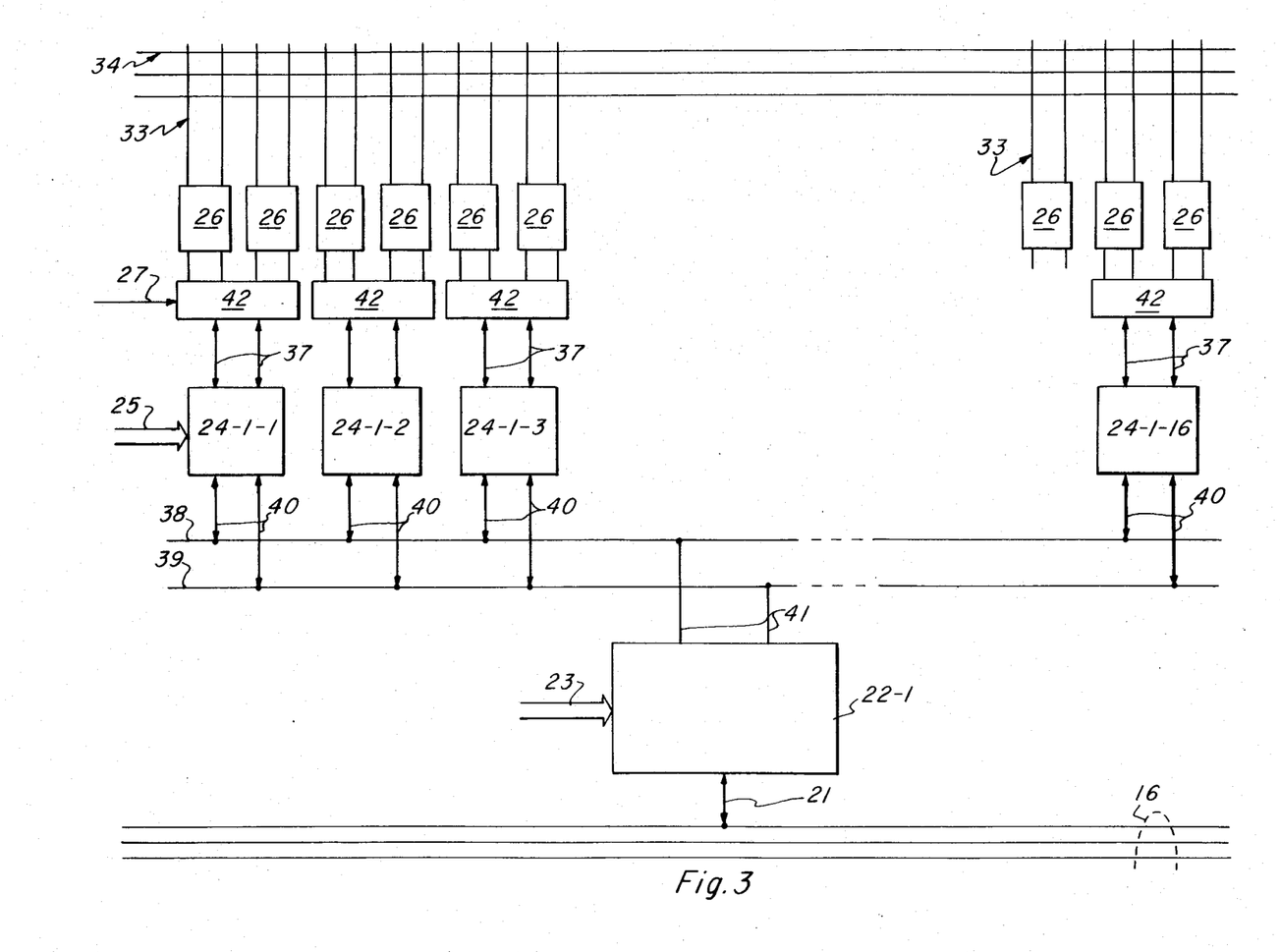
FIG. 3 is an electrical diagram in block form of a part of the circuitry of FIG. 2.

Referring to FIG. 3, a part of the circuitry of FIG. 2 is shown in more detail. The sense amplifiers 26 associated with the set of sixteen buffers 24-1 are shown. This set of buffers 24-1 is labelled 24-1-1 through 24-1-16 in this figure. Each individual sense amplifier 26 has two bit lines 33 extending from it, in the so-called folded bit line configuration. The row lines 34 intersect the bit lines, and memory cells are at intersections of row lines and bit lines. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read or write a bit of data to or from the lines 38, 39 by lines 40. This buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
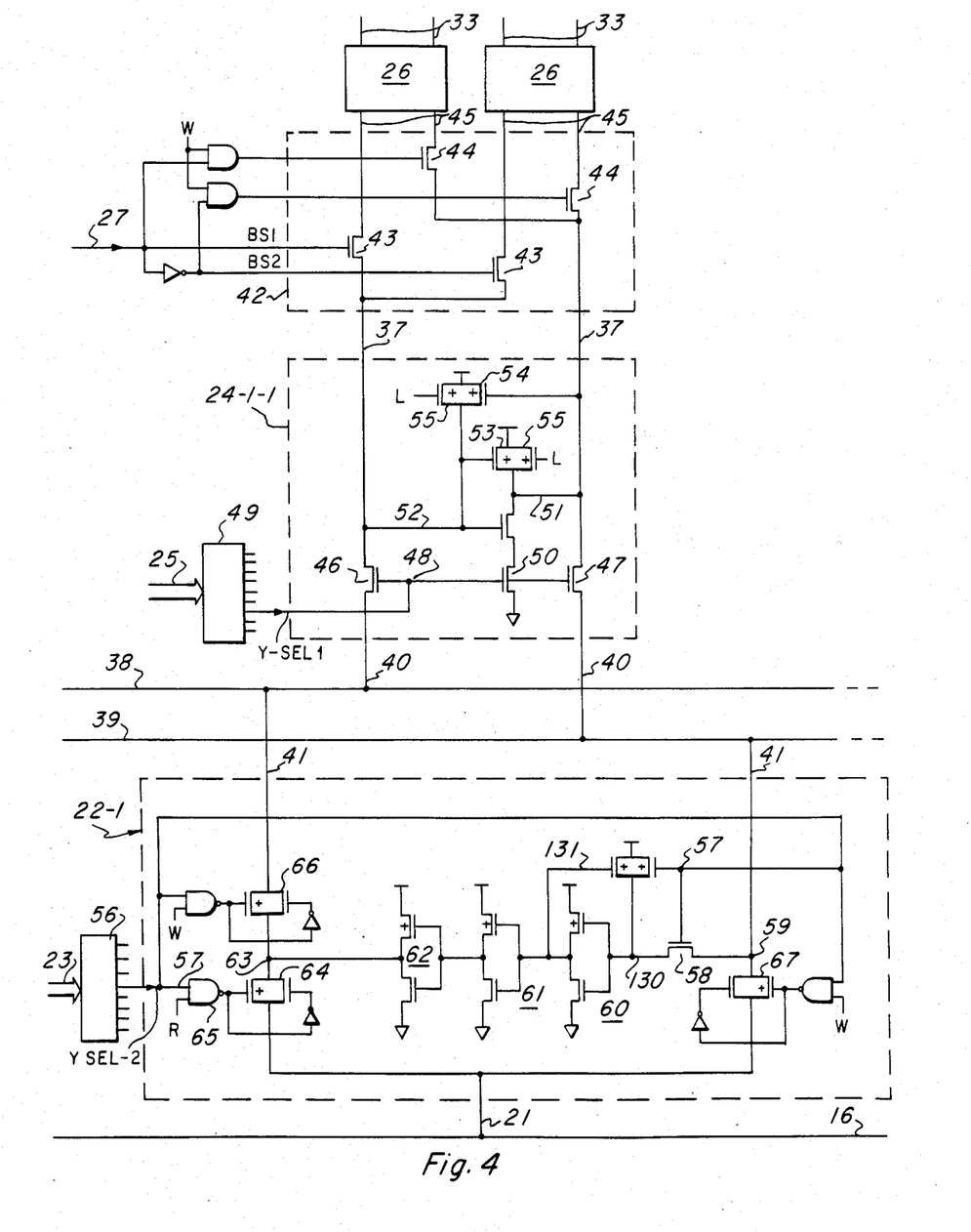
FIG. 4 is an electrical diagram in schematic form of the multiplexers, buffers and column selector circuits of the device of FIG. 3.

Turning now to FIG. 4, a detailed schematic diagram is shown for one of the buffers 24, e.g., the buffer 24-1-1 of FIG. 3, and for one of the buffers 22, e.g., the buffer 22-1. The multiplexer 42 consists of four transistors; one of two transistors 43 is selected by the address bit on line 27 and its complement, so only one of these is on. Only after the sense amp has flipped can 42 be activated. For read, only one path exists, through the selected one of the transistors 43. For write, one of the transistors 44 is also turned on by the address bit 27 which is anded with a write control W from the control circuitry 31, valid when the R/$\overline{W}$ control 30 is in the write condition. Thus, the lines 45 which are inputs or outputs of the sense amplifiers 26 are single-ended for read and dual rail for write; that is, for read operations both of the transistors 44 are off, and only one of the transistors 43 is on, whereas for write operations one transistor 43 and its associated transistor 44 are conductive. The input/output lines 37 for the multiplexer 42 are connected through source/drain paths of transistors 46 and 47 in the buffer 24-1-1 to the lines 38 and 39. The transistors 46 and 47 are controlled by Y-select information on node 48, which comes from a 1-of-16 decoder 49 receiving the 4-bit column address on lines 25. A transistor 50 also is controlled by the Y-select on node 48; this transistor 50 is in series with an inverter transistor which has a P-channel precharge and load circuit. The path for a single-ended read is from the selected sense amp 26 through a transistor 43 to the input 52 of the inverter, and the inverter functions to place on node 51 the complement of the data bit on node 52, when the buffer 24-1-1 is selected due to transistor 50 being on; the output on node 51 is coupled through transistor 47 to line 39, and thus to node 59, inverters 60, 61 and 62, pass gate 64, and line 21 to data I/O line 16 for this block. When node 52 is low, P-channel transistor 53 is on and node 51 is held at the supply voltage Vdd. Likewise, when node 51 is a low, P-channel transistor 54 is held on and node 52 is held high. Both nodes 51 and 52 are precharged high by P-channel transistors 55 which receive a low-going precharge voltage L generated by the circuitry 31 in the precharge cycle after $\overline{RAS}$ goes high.

The buffer 22-1 in FIG. 4 is controlled by Y-select information from address bits on lines 23 and a 2-of-16 decoder 56, so if this buffer is selected a node 57 is high. This condition turns on a transistor 58 and allows the data on line 39 or node 59 to be amplified through three stages 60, 61 and 62 for driving a node 63. For read, a complementary transistor pair 64 is on, due to a read command R from control circuitry 31 applied to NAND gate 65. That is, when R/$\overline{W}$ is high, defining a read operation, then R is high and transistors 64 are both on. At this time, complementary transistor pairs 66 and 67 are off because write control W is low. Thus, the data bit on line 39 controls the line 16 through node 59, cascaded inverters 60, 61 and 62, node 63 and transistors 64, for a read operation. On the other hand, for a write operation, the transistor pairs 66 and 67 will be on, and transistor pair 64 will be off, so node 59 (and line 39) will receive the data bit from line 16 through transistors 67, and node 63 (and line 38) will receive the complement of this bit, thus converting from single-rail (on line 16) to double-rail (on lines 38, 39) during write.

The P-channel transistors 55 have a clock L on their gates. This clock L has two purposes. First, during the first read (assuming multiple reads in static column decode operation) change is dumped through transistor 43 if a zero is read, or little change is transfered if a one is read. At worst, node 52 floats to a Vdd-Vt level, and is held at this level by the sense amplifier. Second, the L clock functions to precharge the node 51 and thus the gate of transistor 54 to Vdd so that if a zero is initially read through transistor 43 to node 52, there will be no current surge through the transistor 54 (i.e. through 54 to 52 to line 37, transistor 43-BS1, and sense amplifier 26 to Vss). This is only switching current since when node 52 goes low then node 51 goes high thus turning off transistor 54.

Figure 5:
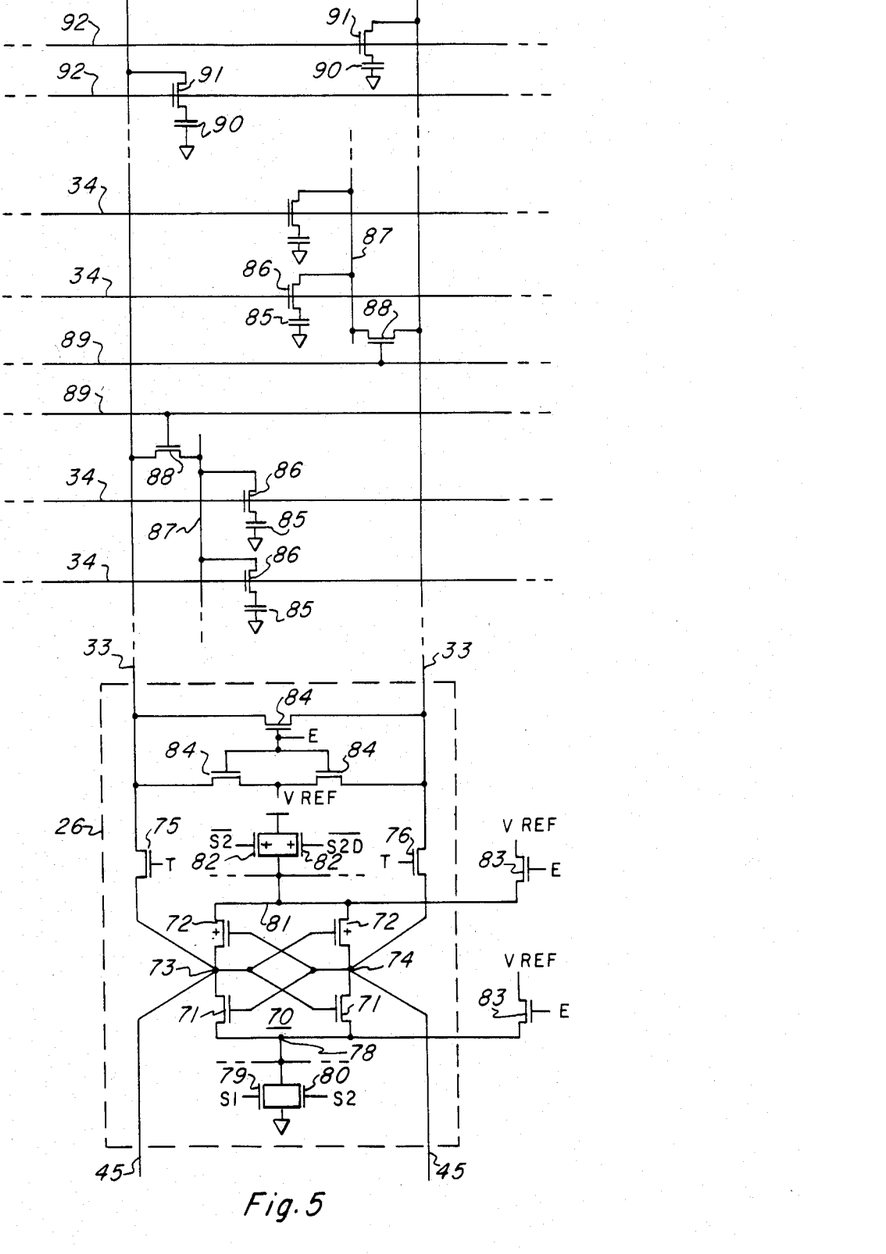
FIG. 5 is an electrical diagram in schematic form of the sense amplifier and cell array of FIGS. 1-4.

Referring to FIG. 5, one of the sense amplifiers 26 is shown in detail. This Figure also shows the two bit lines 33 for this sense amplifier and four of the 512 row lines 34 perpendicular to these bit lines. The sense amplifier employs a CMOS cross-coupled flip-flop 70 having N-channel sensing transistors 71 and P-channel transistors 72. Sense nodes 73 and 74 are connected to bit lines 33 through the source-drain paths of isolating transistors, as explained in copending application Ser. No. 636,938, filed Aug. 2, 1984, by Charvaka Duvvury and Adin E. Hyslop, assigned to Texas Instruments. A node 78 on the ground side of the flip-flop is coupled to ground through two N-channel transistors 79 and 80 which have sense clocks S1 and S2 on their gates. The transistor 79 is much smaller than the transistor 80, and clock S1 occurs first, so the initial sensing is at a lower-gain condition, and is performed by N-channel transistors 71. On the Vdd side, a node 81 is coupled to the supply through a P-channel transistor 82, which has sense clock $\overline{S2}$ on its gate. The sense clock $\overline{S2}$ is the complement of S2, so the P-channel transistor 72 starts to operate only when the second clock S2 is activated, so there is a two-interval sense operation, first S1, then S2 and $\overline{S2}$. The transistor pairs 79,80 and the transistor 82, are shared with all of the other sense amplifiers 26 in two blocks 10a and 10b, i.e., 1024 sense amplifiers. The nodes 78 and 81 are precharged to about one-half Vdd by transistor 83.

The bit lines 33 are precharged and equallized through three transistors 84 which have an equalize clock voltage E on their gates; two of these have their sources connected to a reference voltage Vref. The value of this reference voltage is about half Vdd, so little or no net charge is needed from the supply to precharge all of the bit lines. That is, one line 33 will be high and the other low for each sense amplifier, so one will charge the other, and Vref need only supply any differential that might have occurred due to leakage or the like. The clock E is generated in the control circuitry 31 after the end of an active cycle, when $\overline{RAS}$ goes high.

Each of the memory cells consists of a capacitor 85 and an access transistor 86, with the gates of all of the 512 access transistors 86 in a row being connected to a row line 34. Only one row line 34 of the 512 in the block is turned on at any one time, so only one memory cell capacitor 85 is connected to a bit line 33 for a given sense amplifier 26. According to the invention of application Ser. No. 634,898, filed July 26, 1984, by David J. McElroy, assigned to Texas Instruments, in order to reduce the ratio of the bit line capacitance to the value of the storage capacitance 85, a number of bit line segments 87 are employed for each pair of bit lines 33. Only one of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier (16×32=512). The row decoder 11a or 11b selects the appropriate one of sixteen lines 89 by a segment select voltage SS when this decoder selects 1-of-512 row lines 34, based on certain ones of the same nine address bits from lines 14.

A pair of dummy cells are provided for each pair of bit lines 33, and these dummy cells consist of dummy capacitors 90 and access transistors 91. When the selected storage cell is on the left-hand bit line 33, then the right-hand dummy cell is selected by one of the lines 92, and vice versa, in the usual manner. One bit of the row address is also used to select one or the other of these lines 92 of the dummy cells.

Figure 6:
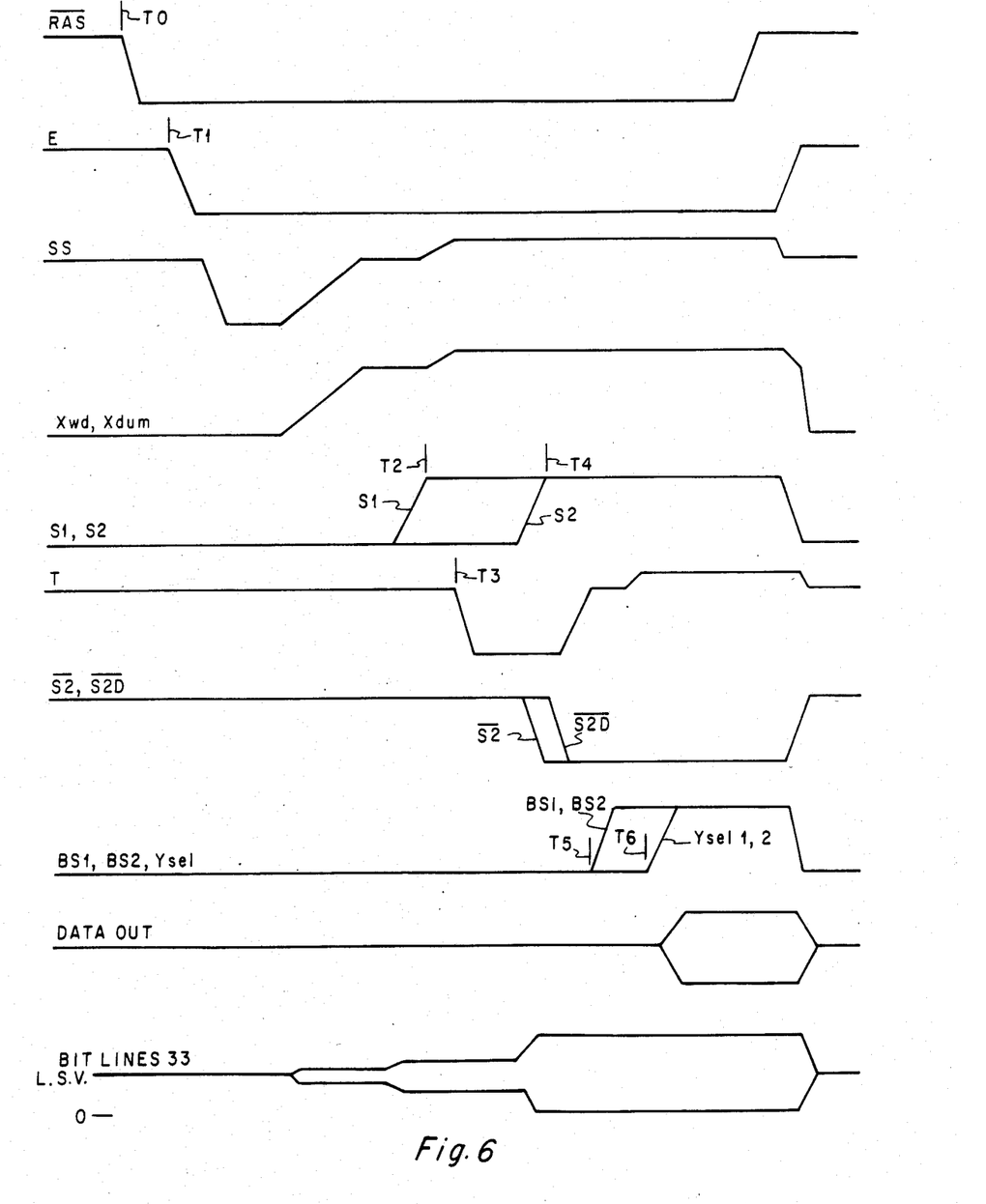
FIG. 6 is a timing diagram showing voltage vs. time for various nodes in the circuit of FIGS. 1-5.

Referring to FIG. 6, the sequence of operation of the memory device will be explained. An active cycle begins with the $\overline{RAS}$ voltage dropping from +5 to zero at the time T0. This example is a read cycle, so at time T0 the R/$\overline{W}$ input voltage is at +5. The time prior to T0 is a precharge cycle, during which the equalize voltage E has been high, so all of the bit lines 33 and the nodes 78, have been precharged to the Vref voltage, assumed to be about ½ Vdd or +2.5. The segment select voltage SS on all lines 89 is also held high during the precharge cycle, so all of the segments 87 are also precharged to the Vref voltage. The dropping of $\overline{RAS}$ at T0 causes the equalize voltage E to drop at T1, isolating the pairs of bit lines 33 from each other and from Vref. The segment select voltage SS then drops, isolating all of the segments 87 from the bit lines 33. As soon as the row decoders 11a, 11b have had time to respond to the row address, the Xwd and Xdum voltages start to rise on the selected 1-of-512 row line 34 and selected 1-of-2 dummy line 92; at the same time, the segment-select voltage on one of the lines 89 is brought up. These address voltages Xwd, Xdum and SS are brought up rather slowly and after reaching the Vdd level, are boosted above Vdd to eliminate the Vt drop across the access transistors 86, 88 and 91. At time T2, ths sense amplifiers are first activated by the S1 voltage going high, turning on the high-impendence N-channel transistor 79; this begins to separate the bit lines 33 further than the separation caused by the differential voltages on the storage cell and dummy cell. But before any current flows from the supply Vdd through transistors 72, the T voltage falls at T3, isolating the bit lines 33 from the sense nodes 73 and 74. After the T voltage falls, the sense voltage S2 is brought up, so the large transistor 80 begins to conduct, also $\overline{S2}$ drops, so the P-channel load transistor 82 begins to conduct. After S2 rises and $\overline{S2}$ drops at T4, the T voltage is brought up to Vdd. The clock $\overline{S2D}$ is fired slightly after S2 in order to phase out current spikes from the Vdd supply. At time T5 after the isolating transistors 75, 76 have been turned back on, sensing is complete and one bit line 33 is high and the other at zero, so the bit-select voltage BS1 or BS2 is turned on, connecting one of the bit lines to the node 52 via lines 45 and 37 of FIG. 4. Just after Ysel-1 and Ysel-2 outputs from decoders 49 and 56 are valid at nodes 48 and 57, so the selected data bit becomes valid on the appropriate one of the lines 16. Slightly after the Ysel-1 and Ysel-2 go high, the data becomes valid on the output pin 19.

If the column address changes, the BS1, BS2, Ysel-1, Ysel-2 voltages will change to produce a new data output bit. The row address stays the same, and the data selected at the initial $\overline{RAS}$ in this cycle is latched in all the sense amplifiers at nodes 73,74. Thus, nothing in FIG. 6 changes prior to T5. The column access time for static column decode is thus very rapid.

Figure 7:
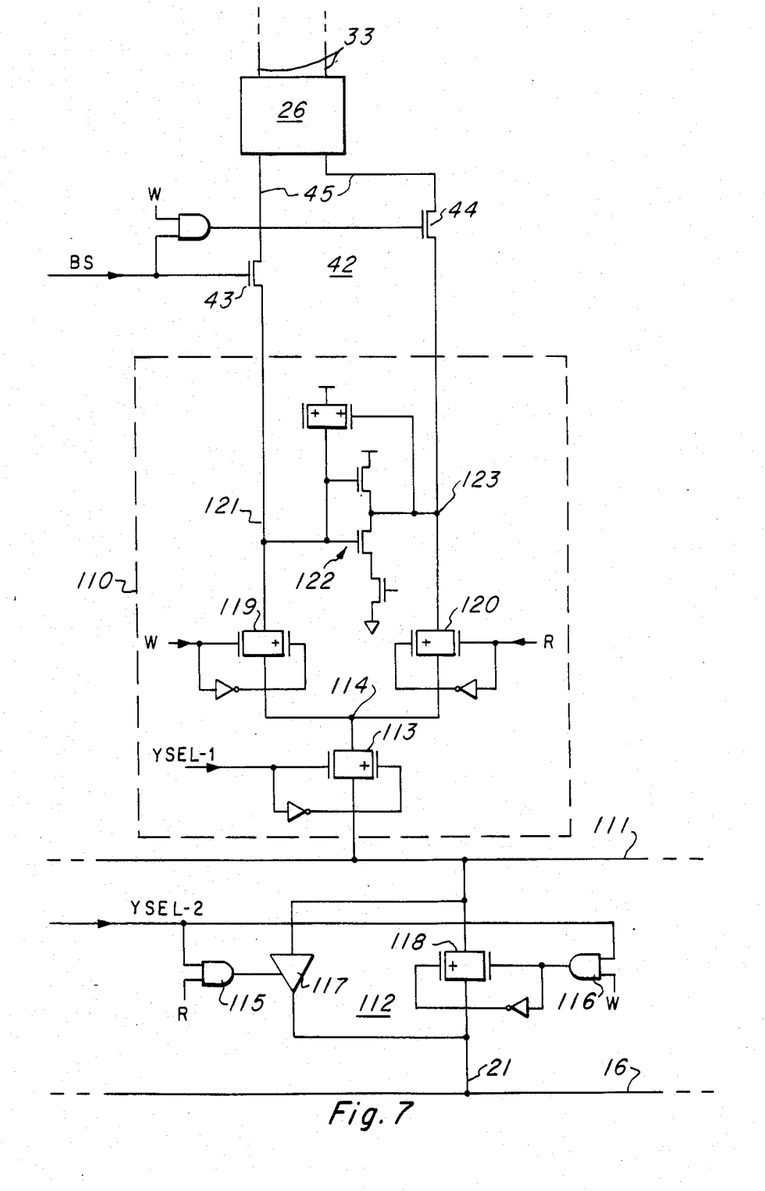
FIG. 7 is an electrical schematic diagram corresponding to FIG. 4 for an alternative embodiment of the invention.

FIG. 7 shows an alternative circuit for use as the intermediate output buffers, instead of the circuit of FIG. 4. Here the I/O buffer 110 (corresponding to the buffer 21-1-1) is connected to only a single sense amplifier 26 by lines 45, and to only a single intermediate I/O line segment 111 (instead of dual lines 38,39). One of the line segments 111 is connected to the data I/O line 16 for this block by a second-stage intermediate I/O buffer 112 (corresponding to the buffer 22-1 of FIG. 4). As before, Y-sel-1 and Y-sel-2, outputs of column decodes 49 and 56, select which of the ;intermediate buffers is coupled to the segmented I/O lines 111 and data I/O lines 16. The Y-sel-1 signal and its complement are applied to the gates of N and P-channel transistors 113, to thereby connect one node 114 (out of thirty-two) to a line 111. The Y-sel-2 signal enables one of the gates 115 or 116, depending upon whether read R or write W is valid; thus, either a buffer 117 (for read) or a pass gate 118 for (write) is activated, for one-of-eight of the buffers 112 for this half of this group, based on the column address bits 23. The read R and write W signals select one or the other of the pass gates 119 and 120 in the buffer 110; the write operation is double-ended (dual rail) via gate 119, line 121 (to sense amp), amplifier 122 and line 123 (to sense amp), whereas a read operation is single-ended via line 121 from the sense amplifier 26, through amplifier 122, line 123, pass gate 120, line 111 and buffer 117 to line 16. The transistors 432 and 44, as in FIG. 4 are driven by the line BS, or the line BS anded with W, so either the transistor 43 (for read) or both transistors 43 and 44 for write, are turned on at the time T5 of FIG. 6.

In the circuit of FIG. 7, the I/O lines 111 (and 16) have no significant coupling onto nodes 73,74 of the sense amplifier 26 when reading, due to the buffers 122 (and 117). Thus there is no significant degrading of the levels on the sense amplifier nodes due to the condition of the I/O lines. In the circuit of FIG. 4 there is some coupling by node 52 and transistor 46 between a sense node and the line 38 during read, but the segment capacitance is so small that the sense amp can react very quickly to any such coupling. The coupling effect can be further diminished by making the transistor 46 relatively small so that it introduces impedance into the coupling. Also, the device sizes are ratioed such that the sense amplifier controls the voltage on node 52 irrespective of the voltage on node 51. And in the buffer 22-1 of FIG. 4, the amplifier 24-1-1 controls the voltage on the node 130 irrespective of the voltage on the node 131.

It should be noted that an extra pass gate could be used in in the amplifier of buffer 24-1-1 of FIG. 4 to filter out coupling from the I/O lines during read. The gate of this transistor would be activated only when writing.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor read/write memory device comprising:
    an array of rows and columns of read/write memory cells, with a plurality of differential sense amplifiers connected to columns of the array, each said sense amplifier having a pair of sense nodes, each sense node connected to a column,
    a plurality of intermediate input/output buffer and decode means coupled between said sense nodes of said sense amplifiers and data I/O terminal means, to write data to both of said sense nodes of a differential sense amplifier but to read data from only one of said sense nodes of a differential sense amplifier.

2. A device according to claim 1 wherein said plurality of intermediate input/output buffer and decode means includes a plurality of segmented dual-rail intermediate I/O buffers.

3. A device according to claim 2 wherein each of said plurality of intermediate input/output buffer and decode means includes a buffer circuit, and includes a first decoder, said first decoder receiving a part of a column address from terminals of said device.

4. In a semiconductor memory device formed in a single semiconductor intetrated circuit:
    an array of rows and columns of memory cells;
    row address means coupled to said rows for selecting one row in response to a row address input;
    a data I/O line for said array:
    a plurality of segmented intermediate I/O lines for said array;
    a plurality of first intermediate I/O buffer means including first column-select means, each of said plurality being coupled to a different group of said columns of the array and coupled to one of said plurality of segmented intermediate I/O lines,
    a plurality of second intermediate I/O buffer means including second column-select means, each of said plurality being coupled between one of said plurality of segmented intermediate I/O lines and said data I/O line;
    and column address means having first and second outputs coupled to said first and second column-select means, respectively, and receiving a column address.

5. A device according to claim 4 wherein said data I/O line is single-rail, and each of said segmented intermediate I/O lines is a dual-rail, true and complement, pair of lines.

6. A device according to claim 4 wherein said memory cells are dynamic one-transistor cells, and wherein said memory device includes a plurality of differential sense amplifiers, each of said sense amplifiers being connected to one of said columns.

7. A device according to claim 6 wherein each of said first buffer means is coupled to one of the sense amplifiers of one of the columns for single-ended read and dual-ended write operations.

8. A device according to claim 4 wherein only one of said first buffer means and only one of said second buffer means is activated by a given column address.

9. A device according to claim 8 wherein the capacitance of each of said segmented intermediate I/O lines is less than that of said data I/O line.

10. A semiconductor memory device comprising:
    an array of N memory cells arranged in rows and columns, where N is a power of 2;
    said array being partitioned into M subarrays, where M is an integer and each subarray contains N/M of said memory cells arranged in rows and columns;
    at least M data I/O lines;
    address input means producing a multibit row address and a multibit column address;
    row decoder means receiving said row address and having an output coupled to said rows in said subarrays,
    each said subarray containing a plurality of R intermediate data I/O segment lines, where R is a power of 2;
    each of said segment lines being selectively coupled to a plurality of S of said columns of said subarray, where S is a power of 2, by a first Y-selector which receives a part of said column address;

each of said M data I/O lines being selectively coupled to said R segment lines by a second Y-selector which receives another part of said column address.

11. A device according to claim 10 wherein each of said segment lines is a dual-rail pair of lines, and wherein each of said data I/O lines is a single-rail line.

12. A device according to claim 10 wherein said array contains B rows and C columns, where B and C are integral powers of 2 and C is greater than B.

13. A device according to claim 12 wherein each of said subarrays contains C/M columns; wherein C/M is greater than R; and C/M is greater than S.

14. A device according to claim 10 wherein each of said columns includes a pair of bit lines with a differential sense amplifier between the pair of bit lines.

15. A device according to claim 14 wherein each of said pairs of bit lines is coupled through said first and second y-selectors to one of said data I/O lines by a dual-rail write path and by a single-rail read path.

16. A device according to claim 15 wherein said memory cells are dynamic one-transistor read/write cells.

17. A device according to claim 16 wherein said address input means receives a row address and a column address in time multiplex.

18. A device according to claim 17 wherein said row address is gated into said row address decoder only by an address strobe, but said column address is applied to said first and second selectors without said address strobe.

19. A device according to claim 17 wherein each of said segment lines is a dual rail, true and complement, pair of lines.

20. A device according to claim 19 wherein the capacitance of each of said segment lines is much less than that of each of said data I/O lines.

21. A semiconductor dynamic memory device formed in a semiconductor bar, comprising:

an array of N dynamic memory cells arranged in B rows and C columns of cells; a plurality of differential sense amplifiers; each column being connected to one of said differential sensing amplifiers;

said array being partitioned into M subarrays, where each subarray contains N/M of said memory cells arranged in rows and C/M columns;

where N, M, B and C are integers and powers of 2, and $N>C>B>M$, and $\sqrt{N}>b$;

at least M single-rail data I/O lines;

an address input means on said bar receiving an address input from external to said bar and producing a multibit row address and a multibit column address, row decoder means on said bar receiving said row address and having an output coupled to said rows in said subarrays, column decoder means on said bar receiving said column address and having at least first and second outputs, a plurality of R segment lines, where R is an integer and $R>M<C$, each of said segment lines being selectively coupled by first buffer means to a plurality of S of said sense amplifiers of said C/M columns of said subarray, said first buffer means including first Y-selector means which receives said first output of said column decoder means, where S is a power of 2 and $C/M>S$;

each of said M data I/O lines being selectively coupled by second buffer means to a plurality of said segment lines of a subarray, said second buffer means including second Y-selector means which receives said second output of said column decoder means.

22. A device according to claim 21 wherein each of said segment lines is a dual-rail, true and complement pair of lines.

23. A device according to claim 21 wherein said first and second buffer means provide dual-rail write to said sense amplifiers, and single-rail read from said sense amplifiers.

24. A device according to claim 21 wherein each of said columns includes a pair of bit lines with a differential sense amplifier between the pair of bit lines.

25. A device according to claim 24 wherein each of said pairs of bit lines is coupled through said first and second buffer means to one of said data I/O lines by a dual-rail write path and by a single-rail read path.

26. A device according to claim 25 wherein said memory cells are dynamic one-transistor read/write cells.

27. A device according to claim 26 wherein said address input means receives said address input as a row address and a column address in time multiplex.

28. A device according to claim 27 wherein said row address is gated into said row address decoder only by an address strobe, but said column address produces said first and second outputs to said first and second selector means without said address strobe.

29. A device according to claim 28 wherein each of said segment lines is a dual rail, true and complement, pair of lines.

30. A device according to claim 29 wherein the capacitance of each of said segment lines is much less than that of each of said data I/O lines, to thereby reduce the loading of said bit lines by coupling through said first buffer means.

* * * * *